US011354536B2

(12) United States Patent
Betts et al.

(10) Patent No.: US 11,354,536 B2
(45) Date of Patent: Jun. 7, 2022

(54) ACOUSTIC SOURCE SEPARATION SYSTEMS

(71) Applicant: Audiotelligence Limited, Cambridgeshire (GB)

(72) Inventors: David Anthony Betts, Cambridgeshire (GB); Mohammad AlDmour, Cambridgeshire (GB)

(73) Assignee: AUDIOTELLIGENCE LIMITED, Cambridgeshire (GB)

( * ) Notice: Subject to any disclaimer, the term of this patent is extended or adjusted under 35 U.S.C. 154(b) by 103 days.

(21) Appl. No.: 16/631,990

(22) PCT Filed: Jul. 19, 2017

(86) PCT No.: PCT/GB2017/052124
§ 371 (c)(1),
(2) Date: Jan. 17, 2020

(87) PCT Pub. No.: WO2019/016494
PCT Pub. Date: Jan. 24, 2019

(65) Prior Publication Data
US 2020/0167602 A1 May 28, 2020

(51) Int. Cl.
*G06K 9/62* (2022.01)
*G10L 21/0272* (2013.01)
(Continued)

(52) U.S. Cl.
CPC ......... *G06K 9/6244* (2013.01); *G06K 9/6242* (2013.01); *G10L 21/0272* (2013.01);
(Continued)

(58) Field of Classification Search
CPC combination set(s) only.
See application file for complete search history.

(56) References Cited

U.S. PATENT DOCUMENTS 6,430,528 B1 * 8/2002 Jourjine .............. G10L 21/0272
375/340
9,668,066 B1    5/2017 Betts et al.
(Continued)

FOREIGN PATENT DOCUMENTS

GB    2548325 A    9/2017
WO    0117109 A1   3/2001

OTHER PUBLICATIONS

Nesta Francesco et al, "Convolutive Underdetermined Source Separation through Weighted Interleaved ICA and Spatio-temporal Source Correlation", Mar. 12, 2012 (Mar. 12, 2012), Network and Parallel Computing; [Lecture Notes in Computer Science; Lect.Notes Computer], Springer International Publishing, Cham, pp. 222-230, XP047371392, ISBN: 9783642175718, ISSN:0302-9743, p. 222, paragraph 1.-p. 226, paragraph 2.2, p. 228, paragraph 5.
(Continued)

*Primary Examiner* — Duc Nguyen
*Assistant Examiner* — Assad Mohammed
(74) *Attorney, Agent, or Firm* — Tarolli, Sundheim, Covell & Tummino LLP

(57) ABSTRACT

A method for acoustic source separation comprises inputting acoustic data from a plurality of acoustic sensors, combined from a plurality of acoustic sources, converting the acoustic data to time-frequency domain data comprising time-frequency data frames, and constructing a multichannel filter for the time-frequency data frames to separate signals from the acoustic sources. The constructing comprises determining a set of de-mixing matrices ($W_f$) to apply to each time-frequency data frame to determine a vector of separated outputs ($y_{ft}$) by modifying each of the de-mixing matrices by a respective gradient value (G;G') for a frequency dependent upon a gradient of a cost function measuring a separation of the sources by the respective de-mixing matrix. The respective gradient values for each
(Continued)

frequency are each calculated from a stochastic selection of the time-frequency data frames.

11 Claims, 6 Drawing Sheets

(51) Int. Cl.
    *H03H 21/00*     (2006.01)
    *H04R 1/40*     (2006.01)
    *H04R 3/00*     (2006.01)
    *H04R 25/00*     (2006.01)
    *G10L 21/0216*     (2013.01)

(52) U.S. Cl.
    CPC ......... *H03H 21/0027* (2013.01); *H04R 1/406* (2013.01); *H04R 3/005* (2013.01); *H04R 25/407* (2013.01); *G10L 2021/02166* (2013.01); *H03H 2021/0034* (2013.01); *H04R 2225/43* (2013.01); *H04R 2430/03* (2013.01); *H04R 2430/20* (2013.01)

(56) References Cited

U.S. PATENT DOCUMENTS

| | | | | |
|---|---|---|---|---|
| 2011/0261977 | A1* | 10/2011 | Hiroe | H04R 3/005 381/119 |
| 2015/0117649 | A1 | 4/2015 | Nesta et al. | |
| 2015/0206541 | A1* | 7/2015 | Qi | G10L 19/032 704/229 |
| 2016/0029120 | A1* | 1/2016 | Nesta | H04M 9/082 381/66 |
| 2016/0125893 | A1* | 5/2016 | Le Magoarou | G10L 21/028 704/204 |
| 2017/0098444 | A1* | 4/2017 | Song | G10L 15/02 |
| 2017/0186442 | A1* | 6/2017 | Cahill | G10L 21/028 |

OTHER PUBLICATIONS

Yusuke Mizuno et al, "Fast source separation based on selection of effective temporal frames", Signal Processing Conference (EUSIPCO), 2012 Proceedings of the 20th European, IEEE, Aug. 27, 2012 (Aug. 27, 2012), p. 914-918, XP032254486, ISBN: 9781467310680, p. 914, paragraph 1.-p. 917, paragraph 3.1; figure 2.

Francesco Nesta et al, "A Flexible Spatial Blind Source Extraction Framework for Robust Speech Recognition in Noisy Environments", Vancouver, Canada Jun. 1, 2013 (Jun. 1, 2013), p. 33-38, Retrieved from the Internet: URL:http://spandh.dcs.shef.ac.uk/chime_workshop/papers/pP3_nesta.pdf, XP055161460 [retrieved on Jan. 12, 2015], p. 33, paragraph 2.-p. 36, paragraph 5.; figure 1.

International Search Report for International Application No. PCT/GB2017/052124 dated Oct. 20, 2017.

\* cited by examiner

ACOUSTIC SOURCE SEPARATION SYSTEMS

RELATED APPLICATIONS

The present invention is a U.S. National Stage under 35 USC 371 patent application, claiming priority to Serial No. PCT/GB2017/052124, filed on 19 Jul. 2017; the entirety of which are incorporated herein by reference.

FIELD OF THE INVENTION

This invention relates to methods, apparatus and computer program code for use in acoustic source separation. An example application is in blind source separation, for example to assist listeners with hearing loss in distinguishing between multiple different simultaneous speakers. Another example application is in-car voice control systems or digital assistant devices where the automatic speech recognition can struggle in the presence of noise.

BACKGROUND TO THE INVENTION

Many people's ability to understand speech is dramatically reduced in noisy environments such as restaurants and meeting rooms. This is one of the first signs of age-related hearing loss, which severely curtails people's ability to interact in normal social situations. With this type of hearing loss, listeners do not necessarily suffer any degradation to their threshold of hearing and they could understand the speech perfectly well in the absence of the interfering noise. Consequently many sufferers may be unaware that they have a hearing problem and conventional hearing aids are not very effective. Blind source separation can help to address this and other problems, by separating a target speaker from interfering speakers.

Similarly, automatic speech recognition systems still struggle in noisy environments, especially when the noisy environment contains several people speaking simultaneously. This leads to frustration as commands are not recognised. Blind Source separation can help by separating the audio input into multiple sources, each of which can be analysed for the presence of voice commands.

Blind source separation involves the separation of a set of source signals from a set of mixed signals, in particular without prior knowledge of the mixing parameters. Techniques are known for blind source separation, for example using independent component analysis (ICA) in combination with a microphone array. In broad terms such techniques effectively act as a beamformer, steering nulls towards unwanted sources. In more detail there in an assumption that the signal sources are statistically independent, and signal outputs are generated which are as independent as possible. The input signals are split into frequency bands and each frequency band is treated independently, and then the results at different frequencies are recombined.

Such techniques are, however, relatively computationally expensive and can produce poor results under certain circumstances. A technique for "Stochastic Optimization with Importance Sampling" by Zhao et al. is described in arXiv: 1401.2753, 2014. However this technique aims to increase the mathematical convergence rate, and because of this only chooses one training example at a time. It is also not suitable for application to certain classes of problem because it relies upon some restrictive constraints on the form of the optimization problem it solves (the definitions in section 3). These make it unsuitable for significantly improving the performance of the blind source separation problems we address.

We will therefore describe improvements to blind source separation and related techniques.

SUMMARY OF THE INVENTION

According to one aspect of the present invention there is therefore provided a method for acoustic source separation, the method comprising: inputting acoustic data from a plurality of acoustic sensors, said acoustic data comprising acoustic signals combined from a plurality of acoustic sources; converting said acoustic data to time-frequency domain data comprising a plurality of time-frequency data frames for a plurality of times and frequencies; and constructing a multichannel filter to operate on said time-frequency data frames to separate signals from said acoustic sources; wherein said constructing comprises: determining a set of de-mixing matrices ($W_f$), one for each of said plurality of frequencies, to apply to each said time-frequency data frame to determine a vector of separated outputs ($\underline{y}_{ft}$), wherein said determining comprises modifying each of said de-mixing matrices by a respective gradient value (G;G') for a said frequency dependent upon a gradient of a cost function measuring a separation of said sources by the respective said de-mixing matrix; and wherein said respective gradient values for each frequency are each calculated from a stochastic selection of said time-frequency data frames.

Embodiments of such a method can reduce the computational burden in constructing the multichannel filter for source separation by a factor of 3-5, and can correspondingly speed up the procedure. In a typical implementation the method is used quasi-statically for blind source separation, that is by constructing the multichannel filter at intervals from the incoming data and using it until a new filter is constructed, on the assumption that the acoustic environment changes relatively slowly. The filter is applied to the time-frequency domain data to determine de-mixed time-frequency data representing the separate sources. De-mixed time-domain data representing at least one of these sources may then be recovered from the de-mixed time-frequency data.

In some embodiments, the de-mixed time-domain data representing at least one of these sources may be processed by a digital assistant or voice command system.

The skilled person will recognise that embodiments of the technique may be employed with a wide range of gradient-based optimisation methods including, but not limited to: steepest ascent/descent, natural gradient, and conjugate gradient based methods (depending upon the gradient value employed). Each of these has an equivalent stochastic interpretation.

In embodiments of the method the stochastic selection of the time-frequency data frames is performed by randomly selecting a plurality (group) of these frames, either as they come in or, more preferably, from a data buffer, for calculating the gradient values for updating the de-mixing matrices. As the skilled person will appreciate, there is a set of de-mixing matrices, one per frequency channel and preferably, but not essentially, the same random choice of frames is used for each for the frequency channels.

In embodiments multiple stochastically selected frames are employed for calculating a gradient. In particular the stochastic selection of a group of frames is made according to a selection probability, $\lambda_t$ associated with each frame, where the index t identifies the frame at time (interval) t. In embodiments the selection probability is dependent upon an importance metric for the frame at time t so that more important frames are given a greater weight/selection probability than less important frames. As the skilled person will appreciate, many different parameters, either singly or in combination, may be used to determine such an importance metric, and some examples are given later.

The skilled person will also appreciate that where (here and elsewhere) reference is made to determining a probability or weight for each frame, typically (though not necessarily) the same probability/weight may be used at each frequency. Thus to provide a probability/weight for each frame typically a probability/weight is determined for each time t and applied for all the frequencies concerned, rather than being determined separately for each time-frequency combination.

In some preferred embodiments the incoming time-frequency data frames are stored in a buffer in association with their respective importance metrics i.e. weights/selection probabilities. In embodiments, therefore, the incoming acoustic data, either before or after conversion to the time-frequency domain, is processed to determine the importance metrics for the frames. Thus, for example, the acoustic data may be processed to determine one or more of: a number of sources, locations of one or more of the sources, and activities of one or more of the sources (for example whether the sources are generating greater than a threshold level of acoustic signal). In general, determining such source characterisation data is easier than performing the source separation and the skilled person will be aware of many techniques which may be employed, including direction-of-arrival estimation techniques. Additionally or alternatively the output of the source separation procedure may itself be used to localise and/or characterise one or more of the sources.

In embodiments an importance metric may be defined with the aim of equalising contributions from sources with different numbers of frames in which the sources are active. Thus, for example, the importance metric of a frame containing a source to include in the procedure may vary inversely with a count of the number of frames in which the source appears (to define a relatively higher importance for frames with a wanted source with a lower than average activity). Thus, broadly speaking, frames containing a wanted source which is otherwise only active intermittently/for short periods may be given a relatively higher weight in order to equalise their contribution. It will be appreciated that the equalisation need not be perfect.

In embodiments of the above described procedure a de-mixing matrix for a frequency channel is iteratively updated using the respective gradient value, which in turn is calculated from a stochastic selection of the time-frequency data frames as described. In a refinement of this process a number of frames contributing to the gradient value may be varied from one iteration to the next. For example more frames may be used to calculate the gradient for a later iterative update than for an earlier iterative update. In broad terms, as the de-mixing matrix approaches its optimal value more frames may be employed to calculate a more accurate gradient for updating the de-mixing matrix, but because this is slower fewer frames may be used initially. This results in a further overall decrease in the computational load/increase in speed.

As the skilled person will appreciate, the overall scale of a de-mixing matrix ($W_f$) is not mathematically relevant to its ability to separate the sources—that is a scaled version of a de-mixing matrix performs the same source separation (the scaling ambiguity can be dealt with separately). Thus in a further optional refinement a de-mixing matrix may be pre-scaled, for example on each iteration, in particular to increase the stability of the iterative procedure for determining the de-mixing matrix. In embodiments the technique prescales the demixing matrices to minimise a substitute cost function, that is a cost function with minima corresponding to stationary points of a likelihood of the separated signals given the de-mixing matrix ($W_f$). In embodiments the pre-scale aims to minimise a measure of the difference between a gradient value matrix G and the identity matrix I, in particular $\|I-G\|_F^2$ (where F denotes the Frobenius norm), rather than to maximise the likelihood, as this gives theoretically better stability guarantees.

In one approach a scalar prescale may be applied, effectively to prescale all the sources (channels) in tandem. In another approach a diagonal prescaling matrix may be applied to the de-mixing matrix to scale each source (channel) independently; this is particularly useful when there is a volume imbalance between the sources/input channels.

In a related aspect the invention provides apparatus for acoustic source separation, the apparatus comprising: one or more inputs to receive acoustic data from a plurality of acoustic sensors, said acoustic data comprising acoustic signals combined from a plurality of acoustic sources; and an audio signal processor coupled to said one or more inputs, the audio signal processor comprising: a time-to-frequency domain converter to convert said acoustic data to time-frequency domain data comprising a plurality of time-frequency data frames for a plurality of times and frequencies; and a multichannel filter module to operate on said time-frequency data frames to separate signals from said acoustic sources; and wherein said audio signal processor is further configured to: determine a set of de-mixing matrices ($W_f$), one for each of said plurality of frequencies, to apply to each said time-frequency data frame to determine a vector of separated outputs ($\underline{y}_{ft}$), by modifying each of said de-mixing matrices by a respective gradient value (G;G') for a said frequency dependent upon a gradient of a cost function measuring a separation of said sources by the respective said de-mixing matrix; and to calculate said respective gradient values for each frequency from a stochastic selection of said time-frequency data frames.

The invention further provides a method for acoustic source separation or adaptive beamforming, the method comprising: inputting acoustic data from a plurality of acoustic sensors, said acoustic data comprising acoustic signals combined from a plurality of acoustic sources; converting said acoustic data to time-frequency domain data comprising a plurality of time-frequency data frames for a plurality of times and frequencies; and constructing a multichannel filter to operate on said time-frequency data frames to perform said acoustic source separation or adaptive beamforming by determining a set of matrices to apply to each said time-frequency data frame, and assigning a weight to each of a set of said time-frequency data frames when constructing said multichannel filter.

As the skilled person will appreciate, although embodiments of the method are described with reference to blind source separation, applications of the technique are not limited to this and may also be applied to frequency domain adaptive beamforming techniques such MVDR (Minimum Variance Distortionless Response) and other beamforming. In these case frames are selected for determining the spatial covariance matrix which is then processed (for example inverted in MVDR) to determine one or more beam directions.

In acoustic source separation embodiments, however, the method also determines a set of de-mixing matrices, one for each of the plurality of frequencies, to apply to each said time-frequency data frame to determine a vector of separated outputs. This determining comprises iteratively updating each of the de-mixing matrices by a respective gradient value for a frequency dependent upon a gradient of a cost function measuring a separation of the sources by the respective de-mixing matrix. A gradient value for a de-mixing matrix is determined by summing estimated values derived from operating with the de-mixing matrix on some or all of the set of time-frequency data frames. The summing is weighted by the weights assigned to the set of time-frequency data frames.

In some embodiments the set of time-frequency data frames comprises a time sequence of frames each with a respective weight; optionally the weights may also vary across frequency. In other embodiments the weighting is applied stochastically by selecting frames from the set, with a probability of selection dependent upon the assigned weight for a frame.

As previously described, in some preferred embodiments, to provide a weight/probability for each frame the same weight/probability may be used at each frequency—in embodiments a weight/probability is determined for each time t and applied for all the frequencies concerned, rather than being determined separately for each time-frequency combination.

In preferred embodiments the frames are stored in a buffer in association with their respective weights. This may be a first in first out (FIFO) buffer, for example implemented as a circular buffer, but in this approach there is an implicit assumption that older frames are less important, which is often not the case. Thus it can be preferable to update the buffer by overwriting a least important frame as determined by its respective weight (where a low weight corresponds to low importance). In this way there may be no set duration for which frames are stored and, in particular, there may be no time limit beyond which old frames are discarded. Potentially the buffer may be updated based upon a difference in weight between a new frame (from new acoustic data) and the least important existing frame, so that the buffer is only updated when a new frame is better than those which are presently stored. Again frames may be selected randomly from the buffer for use in calculating a gradient for updating a de-mixing matrix, where the random selection of a frame has a probability dependent upon the weight of the frame.

In embodiments the weights assigned to each frame may be changed dynamically in the light of updates to the frame buffer. Moreover the weights used for the choosing the frames to replace in the buffer may be the same, but are not necessarily the same as those used in calculating the filter coefficients As we have previously described, various approaches may be employed to assign a weight/probability/importance to a frame. We now describe some further techniques which may additionally or alternatively be employed with this and the previously described aspects of the invention.

Thus in one further approach, counter-intuitively relatively higher weights may be allocated to frames containing a source of audio interference. This is because if such a source can be de-mixed it may then effectively be 'tuned out'. Similarly, relatively higher weights may be allocated to frames comprising one or more target sources.

Thus 'required' sources for the filter may include both one or more wanted or target sources and one or more sources of interference. These frames may be distinguished from other frames which are not required in the de-mixing problem, which may be termed 'extraneous' frames. This latter category of frames may also include one or more sources of interference which, following de-mixing, may then effectively be 'smeared' across the de-mixed sources. This may be useful for white noise type interference as distribution in this manner may be relatively unobjectionable.

In another approach a relatively lower weight may be allocated to frames with more acoustic sources than there are acoustic sensors (microphones). This is because the de-mixing tends to break down in such situations because there is not enough information to properly separate the sources, and such frames are at best not helpful. (Note that a problem with more sources with sensors occurs if there are more sources than sensors over the entire frame buffer, not just individual frames: In this case one can designate certain sources as 'extraneous' and give the frames that contain those extraneous sources zero, or very low, weights; the source separation does not change from one frame to the next, it only changes each time the multi-channel filter coefficients are updated).

In a still further approach a relatively lower weight may be allocated to frames including an acoustic source without recent activity. This is based on the heuristic that an 'old' source is less likely to be active again in the present.

Again, some preferred implementations of these techniques are for blind source separation, applying the multi-channel filter to the time-frequency domain data to determine de-mixed time-frequency data representing the (de-mixed) acoustic sources. This may then be converted into the time domain to recover de-mixed time domain (sound) data for one or more of the sources.

In a related aspect the invention provides apparatus for acoustic source separation or adaptive beamforming, the apparatus comprising: one or more inputs to receive acoustic data from a plurality of acoustic sensors, said acoustic data comprising acoustic signals combined from a plurality of acoustic sources; and an audio signal processor coupled to said one or more inputs, the audio signal processor comprising: a time-to-frequency domain converter to convert said acoustic data to time-frequency domain data comprising a plurality of time-frequency data frames for a plurality of times and frequencies; and a multichannel filter module to operate on said time-frequency data frames, to separate signals from said acoustic sources or perform adaptive beamforming, by determining a set of matrices to apply to each said time-frequency data frame, and assigning a weight to each of a set of said time-frequency data frames when constructing said multichannel filter.

Again embodiments of this system may be applied to source separation or beamforming such as MVDR. The preferred features of the previously described methods may also be implemented in the context of this apparatus.

In addition, in embodiments the apparatus may further comprise at least two frame buffers. Thus a first frame buffer may be used to store time-frequency data from each acoustic sensor for processing to determine the matrices, and a second frame buffer, smaller than the first, may be used for storing incoming time-frequency data from each acoustic sensor during the processing. A frame buffer manager may provide an update mechanism to update the first frame buffer with a selected subset of data from the second frame buffer dependent upon the weights.

In all of the above described aspects/embodiments of the invention it will be appreciated that the acoustic data may be either analogue or digital. In embodiments a preferred approach to transform the input audio from the time domain into the time-frequency domain is to employ an STFT (Short-Time Fourier Transform). Thus, for example, overlapping time domain frames may be transformed, using a discrete Fourier transform, into the time-frequency domain. The skilled person will recognise, however, that many alternative techniques may be employed, in particular a wavelet-based approach.

It will further be appreciated that features of the above described aspects and embodiments of the invention may be combined.

The skilled person will appreciate that the above described techniques may be employed with a wide range of types of multichannel filter for source separation, adaptive beamforming, and the like (in general, types of signal separation algorithm). Thus although later we describe implementations using the example of maximum likelihood independent component analysis (ML-ICA), the techniques are also applicable to other types of ICA such as Fast ICA as well as to, for example, independent vector analysis (IVA), spectrum-based beamforming procedures, and the like.

Typically all these procedures employ a de-mixing matrix which, when applied to multi-channel time-frequency observations, results in de-mixed outputs (in the time-frequency domain), the de-mixing matrix for each frequency channel being determined by an iterative update approach. The update involves determining a cost function which, in broad terms, defines how well the observed acoustic input fits a model based on the unknown sources and de-mixing matrices. Thus in ML-ICA the cost function defines the likelihood of the observations given the postulated de-mixing matrices (and unknown acoustic sources). However other cost functions may be employed, and more generally the cost function may be considered a measure of the effectiveness of the de-mixing matrix in separating the sources. The gradient of the cost function (either positive or negative) then effectively defines the 'direction' in which the elements of a de-mixing matrix should be adjusted to proceed uphill (or downhill) to optimise (maximise) the separation between the sources. In general the optimisation is an iterative process, moving stepwise up (or down) the slope of the cost function towards a solution. The skilled person will appreciate that the techniques we describe may be applied in the context of any method for constructing a multichannel filter for separating signals which proceeds in this manner.

Typically, embodiments of the methods we describe allocate audio sources to channels. However if too many channels are available the method may split a source over multiple channels, and fragmenting real sources in this way is undesirable. In embodiments, therefore, the method may pre-process the acoustic data to reduce an effective number of acoustic sensors to a target number of "virtual" sensors, in effect reducing the dimensionality of the data to match the actual number of sources. This may either be done based upon knowledge of the target number of sources or based on some heuristic or assumption about the number of likely sources. The reduction in the dimensionality of the data may be performed by discarding data from some of the acoustic sensors, or may employ principal component analysis.

In embodiments the dimension reduction is performed by multiplying the input time-frequency observations ($x_{ft}$) by a non-square dimension-reduction matrix, $D_f$, so that the output vector is shorter than the input vector ($x_{ft} \leftarrow D_f x_{ft}$).

Alternatively the dimension reduction may be performed inside the multichannel filter construction procedure, using the transform $W_f \leftarrow W_f D_f$ so that W is converted from a square to a rectangular matrix (where $D_f$ is then effectively a projection onto a subspace in which the procedure operates). Although this latter approach looks more computationally expensive as W is larger, the cost may be effectively the same in, for example, an SIMD architecture.

In embodiments the method may also compensate for a scaling ambiguity in the demixing matrices. In broad terms, whilst the independent component analysis may make the outputs of the procedure (source estimates) substantially independent, the individual frequency bands may be subject to an arbitrary scaling. Conceptually this can be compensated for by establishing what a particular source would have sounded like at one or more of the acoustic sensors (or even at a virtual, reference acoustic sensor constructed from the original microphones), for example using one of the acoustic sensors (microphones) as a reference (or, for a stereo output signal, using two reference microphones). In practice resolving the scaling ambiguity only needs knowledge of the demixing matrix, the pseudo-inverse of which gives the minimum distortion of the sources when mapped back to the microphones. The user, or the procedure, may select a source to "listen to", for example by selecting an element of the output data $y_f(s)$ corresponding to an estimate of the signal from source (channel) s.

Embodiments of the method perform the blind source separation at intervals on successive time series acoustic data. However the labelling of sources (indexed by, say, s) may change from one interval to the next, for example if W is initialised randomly rather than, say, based on a previous calculation. It is therefore helpful to be able to identify which real source corresponds to which source label (index s) in each interval, to thereby partially or wholly remove a source permutation ambiguity. The skilled person will appreciate that a number of different techniques may be employed to achieve this. For example in some applications a desired target source may have a substantially defined or fixed spatial relationship to the acoustic sensors (microphone array), for example when it is desired to target speech output from a driver or passenger of a car using microphones built into the dashboard. In another approach a loudest source (that is the direction from which there is most audio power) may be assumed to be the target source—for example where it is desired to distinguish between a speaker and background from an air conditioning unit in, say, a video conference setting. However some preferred embodiments of the techniques we describe already employ pre-processing to characterise the sources, for example to identify source activity and direction/location, and thus this information may be used to pair real sources with the source labels to remove any source identification ambiguity in the demixing.

Optionally the system or a user may select a target direction for a target source to be selected. Then the procedure may identify the source which best matches this selected direction. This may be performed by, for example, selecting the source with the highest phase correlation between the microphone array phase response from the selected direction and the corresponding portion (row) of the set of demixing matrices.

The skilled person will appreciate that embodiments of the procedure directly produce source estimates (y) or a selected source estimate (y(s)), albeit in the time-frequency domain. Such a source estimate may be used in the time-frequency domain or may be converted back to the time domain. Alternatively, however, the demixing matrices W may be converted from the time-frequency domain to the time domain, for example using an inverse Fourier transform, to determine a time domain demixing filter. This may then be applied to time-domain input data, to perform the demixing in the time domain.

In general the parameters of the multichannel filter, in either the time-frequency domain or the time domain may be stored, transmitted (for example over a network or other communications link), or used in some other way, for example displayed; and/or they may be applied to the input data, in either the time-frequency domain or the time domain, and the resulting filtered (source-separated data) may be listened to, stored, transmitted, or used in some other way such as displayed.

The calculations to implement the above described blind source separation technique may be relatively time consuming but it may be desirable for embodiments of the method to be able to operate in substantially real time. To achieve this the procedure may be operated at intervals on sections of captured acoustic data to establish coefficients for a demixing filter, that is to determine the demixing matrices $W_f$. These coefficients may then be downloaded at intervals to a configurable filter operating in real time on the acoustic data from the acoustic sensors.

A demixed audio signal output, typically from an automatically or manually selected source, may be output and/or used in many ways according to the application. For example where the system is used as a listening aid the audio output may be provided to headphones, earbuds or the like, or to a conventional hearing aid. Alternatively the audio output may be provided to other electronic apparatus such as a video conferencing system or fixed line or mobile phone (for example, with an in-vehicle communications system).

The skilled person will appreciate that in the previously described apparatus the audio signal processor may be implemented in hardware (such as dedicated electronic circuitry), firmware, software or a combination of these; on a dedicated digital signal processor, or on a general purpose computing system such as a laptop, tablet, smartphone or the like.

The skilled person will further appreciate that embodiments of the above described methods may be implemented locally, for example on a general purpose or dedicated computer or signal processor, phone, or other consumer computing device; or may be partly or wholly implemented remotely, in the cloud, for example using the communication facilities of a laptop, phone or the like.

The invention further provides processor control code to implement the above-described methods and apparatus, for example on a general purpose computer system or on a digital signal processor (DSP). The code is provided on a non-transitory physical data carrier such as a disk, CD- or DVD-ROM, programmed memory such as non-volatile memory (eg Flash) or read-only memory (Firmware). Code (and/or data) to implement embodiments of the invention may comprise source, object or executable code in a conventional programming language (interpreted or compiled) such as C, or assembly code, or code for a hardware description language. As the skilled person will appreciate such code and/or data may be distributed between a plurality of coupled components in communication with one another.

BRIEF DESCRIPTION OF THE DRAWINGS

These and other aspects of the invention will now be further described, by way of example only, with reference to the accompanying figures in which.

DETAILED DESCRIPTION OF PREFERRED EMBODIMENTS

Broadly speaking we will describe techniques for blind source separation which, in embodiments, operates on the audio outputs of a small microphone array to separate a desired source from one or more interfering sources. In one application a user can listen to the desired source in real time over headphones or via a hearing aid. However the technology is not just applicable to listening aids and can be useful in any application where a sensor array is measuring a linear convolutive mixture of sources. In audio this includes applications such as teleconferencing and machine hearing.

Figure 1:
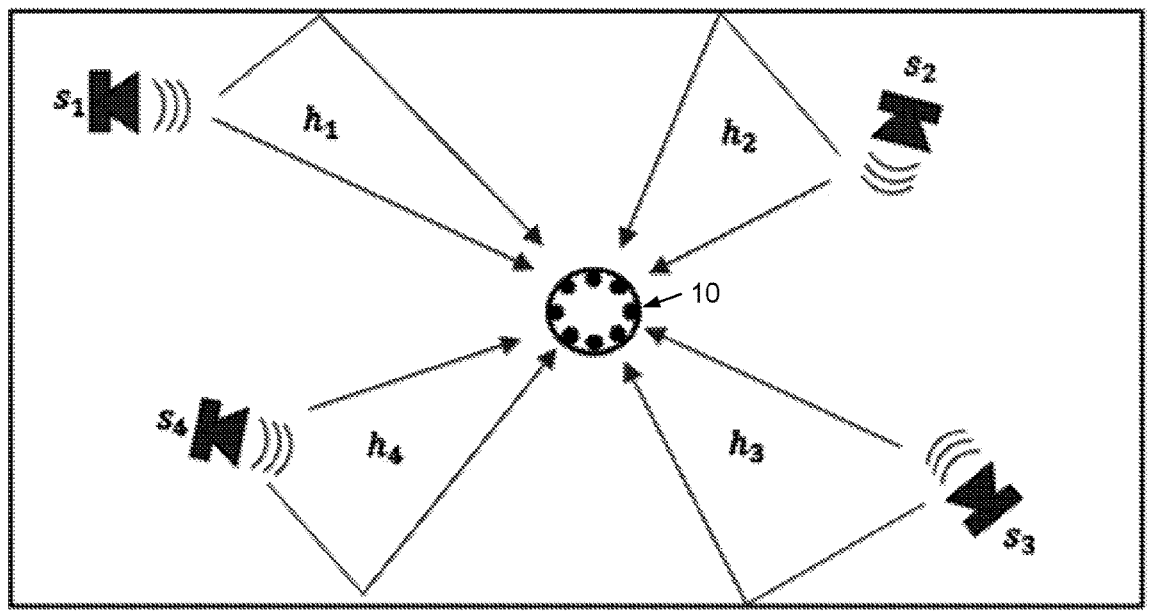
FIG. 1 shows an example acoustic environment to illustrate the operation of a system according to an embodiment of the invention.

By way of example, consider the acoustic scene of FIG. 1. This comprises four sources $s_1$-$s_4$ with respective audio channels $h_1$-$h_4$ to a microphone array 10 comprising (in this example) 8 microphones. The aim is to demix the microphone signals to make estimates of the original sources—that is to perform Blind Source Separation or Blind Signal Separation (BSS). We assume minimal information about the sources and the microphone locations. In some applications the microphone array may be placed on a table or chair in a social setting or meeting and embodiments of the systems we describe are used to separate a desired source, such as a person speaking, from undesired sounds such as other speakers and/or extraneous noise sources.

Using the multi-channel observations x, the example task is to design a multi-channel linear filter w to create source estimates y.

$$y_t = \Sigma_\tau w_\tau x_{t-\tau} \quad (1)$$

We will assume that there are M microphones/sensors/input channels and S audio sources. In practice there may be more sensors than sources, in which case it is desirable effectively to reduce the number of sensors ("dimension reduction") so that, for example, a real source is not split across two different reconstructed sources. If the number of sources is greater than the number of sensors this may either be ignored or, more preferably, frames where the extraneous sources are absent are pre-selected for processing.

We first describe conversion to the time-frequency domain, then independent component analysis for blind source separation, then various improvements, which may be used alone or in combination.

STFT Framework

We process the audio in the time-frequency domain. There are many ways of transforming time domain audio samples to and from the time-frequency domain and the techniques we describe can be applied inside any such framework. However in embodiments we employ Short Time Fourier Transforms (STFTs). In multi-channel audio, the STFTs are applied to each channel separately.

Within this framework we define:

M is the number of microphones.
S is the number of sources, and we assume S≤M.
F is the number of STFT frequencies.
T is the number of STFT frames.

In the STFT domain, the source estimate convolution eq (1) becomes a matrix multiplication.

At each frequency we have the M× T observation matrix $X_f$, and an unknown demixing matrix $W_f$ such that the demixed output $Y_f$ is given by $$Y_f = W_f X_f \qquad (2)$$

Here the demixed output $Y_f$ is a S×T matrix where s labels sources, and the demixing matrix $W_f$ is a S×M matrix. Equivalently, in the description below we refer to a vector of observations of length M, $\underline{x}_{ft}$ (the input audio data in the time-frequency domain), and to a demixed output vector of length S, $\underline{y}_{ft}$ (the demixed output audio data in the time-frequency domain). Thus:

$$\underline{y}_{ft} = W_f \underline{x}_{ft} \qquad (3)$$

ML-ICA

Maximum likelihood independent component analysis, ML-ICA is a frequency-domain ICA algorithm that can be applied to the problem of blind source separation. We will describe techniques which provide improved performance and reduced computational complexity in the context of this problem.

ML-ICA operates in the STFT domain on the multi-channel time-frequency observations $\underline{x}_{ft}$ to calculate a set of de-mixing matrices W, one per frequency. Here multi-channel refers to the multiple (acoustic) sensor channels, typically microphones, and "frequency" is short for "frequency channel". The multi-channel observations are stored in a T×F frame buffer X. As new frames are received, the frame buffer can be updated and the de-mixing matrices re-calculated.

Thus for each frequency, ML-ICA designs a demixing matrix $W_f$ such that the separated outputs are given by $$\underline{y}_{ft} = W_f \underline{x}_{ft}$$

The de-mixed outputs represent the original audio sources up to a permutation and scaling ambiguity which may be solved separately.

The ML-ICA log likelihood for each frequency is given by $$L(X_f; W_f) = \sum_{t=1}^{T} L(\underline{x}_{ft}; W_f)$$

$$L(\underline{x}_{ft}; W_f) = const + \left( \ln \det W_f W_f^H - |\underline{y}_{ft}|_1 \right)$$

(This assumes that the demixed output y is drawn from a Laplace distribution; the subscript "1" indicates the L1 norm).

The objective is to find $W_f$ that maximises the likelihood.

As we are operating in the complex domain we use the Wirtinger derivative $\nabla L$. Define sign( . . . ) as the element wise complex sign operator. We then have $$\nabla L = \sum_{t=1}^{T} \left( 2 W_f^{-H} - \text{sign}(\underline{y}_{ft}) \underline{x}_{ft}^H \right)$$

We do this by iteratively updating the estimate of $W_f$ using the natural gradient. The natural gradient is the steepest ascent of L when projected onto an appropriate Riemannian manifold. In the present case we use the manifold of invertible matrices and the natural gradient $\delta W_f$ is given by $$\delta W_f \propto \nabla L W_f^H W_f$$

With a step size of $$\frac{\mu_k}{2T}$$

for each iteration we get $$W_f \leftarrow W_f + \frac{\mu_k}{2T} \nabla L W_f^H W_f =$$

$$W_f + \mu_k \left( W_f^{-H} - \frac{1}{2T} \sum_{t=1}^{T} \text{sign}(\underline{y}_{ft}) \underline{x}_{ft}^H \right) W_f^H W_f =$$

$$\left( (1 + \mu_k) I - \frac{\mu_k}{2T} \sum_{t=1}^{T} \text{sign}(\underline{y}_{ft}) \underline{y}_{ft}^H \right) W_f$$

For each frequency, ML-ICA performs the following algorithm:

1. Initialise $W_f$
2. For each iteration $k \in 1: K$
   a. calculate $\underline{y}_{ft} = W_f \underline{x}_{ft}$ for each frame.
   b. $G = \frac{1}{2T} \sum_t \text{sign}(\underline{y}_{ft}) \underline{y}_{ft}^H$
   c. $W_f \leftarrow ((1 - \mu_k) I - \mu_k G) W_f$ The algorithm has converged when G=I. Here and later G is a gradient value related to the gradient of the cost function, and closely related to the natural gradient. The number of iterations K can be either be fixed or we can use a convergence criterion such as $\|I - G\|_F^2 < \epsilon$ (where F denotes the Frobenius norm).

Any rank S matrix can be used to initialise $W_f$. In the absence of any prior information, a good candidate is to use principal component analysis and initialise $W_f$ to the S most significant components. It will be appreciated that the algorithm is used for each frequency f to determine the set of demixing matrices W.

The main computational burden is steps 2a and 2b which are each O(SMT).

The factor of ½ in calculating G only affects the scaling of the final result and may be ignored in implementations.

The expression of the step size of $$\frac{\mu_k}{2T}$$

in terms of T is merely for mathematical convenience. The step size may be changed (reduced) from one iteration to the next, but this is not necessary; in practice a fixed value of µ=0.5 has been found to work well.

Importance Weighting

Not all frames have equal value. For example an important source may only have a few frames where it's active, or some frames may be corrupted by an unimportant source such as a door slam. Recent frames may be considered more relevant than older ones, though this is not necessarily the case. In embodiments therefore the system weights the frames according to their importance (to the particular problem/application), and this can improve the quality of the source separation.

Assuming we have a process that can identify appropriate weights for each frame $\lambda_t$ ($\lambda_t \geq 0$) we can reformulate the ML-ICA using $$L(X_f; W_f) = const + \sum_t \lambda_t \left( \ln \det W_f W_f^H - |\underline{y}_{ft}|_1 \right)$$

Without loss of generality, we can assume $\Sigma_t \lambda_t = 1$ (analogous to probability, although summing to 1 is not a requirement, because we only need to find $W_f$ that maximises the likelihood).

The natural gradient algorithm for each frequency then becomes:

1. Initialise $W_f$
2. For each $k \in 1: K$
   a. calculate $\underline{y}_{ft} = W_f x_{ft}$ for each frame.
   b. $G = \frac{1}{2T} \sum_t \lambda_t \text{sign}(\underline{y}_{ft}) \underline{y}_{ft}^H$
   c. $W_f \leftarrow ((1 - \mu_k)I - \mu_k G) W_f$ Here the sum over t is over all T frames. The convergence criterion are the same as for standard ML-ICA (and setting $$\lambda_t = \frac{1}{T}$$

gives unweighted ML-ICA as previously described). Optionally the weights may also vary across frequency as well as across frames. Some example techniques for assigning the weights are described later.

Stochastic Gradient-Based Improvements

A stochastic gradient ascent (or descent) method can be used to improve the performance of the procedure.

Where stochastic gradient ascent (or descent) is used 'on-line', for each new frame received, the gradient $\nabla L$ is approximated by the gradient with respect to that fame. For the example of ML-ICA this leads to $$\nabla L = \lambda_t (W_f^H - \frac{1}{2} \text{sign}(\underline{y}_{ft}) \underline{x}_{ft}^H)$$

The algorithm is then
1. Initialise $W_f$
2. For each frame
   a. $\underline{y}_{ft} = W_f \underline{x}_{ft}$.
   b. $G' = \frac{1}{2} \lambda_t \text{sign}(\underline{y}_{ft}) \underline{y}_{ft}^H$
   c. $W_f \leftarrow ((1+\mu)I - \mu G') W_f$ Note that here G' is determined from data for a single frame (typically the latest frame) rather than by summing data derived from multiple frames. Thus t refers to the time of the latest frame and the procedure relies upon an approximation to $\nabla L$ rather than the "true" value obtain by summing over all the frames.

Importance Subsampled Stochastic Gradient ICA (ISSG-ICA)

We now describe an improvement that uses importance subsampled stochastic gradient ICA. In this technique we use importance sampling to (randomly) choose a group of frames with respective probabilities $\lambda_t$ in order to estimate $W_f$ in a more computationally efficient manner (i.e. with less computation, as contrasted with improving the convergence rate).

Let R be a random process that will choose frame t with probability $\lambda_t$.

1. Initialise $W_f$
2. For each $k \in 1: K$
   a. Use $R$ to choose $L_k$ frames
   b. For each chosen frame $\underline{y}_{fl} = W_f x_{fR(l)}$
   c. $G' = \frac{1}{2L_k} \sum_l \text{sign}(\underline{y}_{fl}) \underline{y}_{fl}^H$
   d. $W_f \leftarrow ((1 - \mu_k)I - \mu_k G') W_f$ In step (c) the sum is over the $L_k$ chosen frames defined by the random process R. The subscript k implies that L may (but need not be) different from one iteration k to another. For example $L_k$ may be adjusted between iterations to maximise the expected convergence of the procedure.

For each iteration one can show that the expected value of G' given $W_f$ is the same as G from the importance weighted ICA algorithm, which thus validates the procedure.

$$E\{G'; W_f\} = \frac{1}{2} \sum_t \lambda_t \text{sign}(\underline{y}_{ft}) \underline{y}_{ft}^H$$

Under a fairly weak set of assumptions, the procedure can be shown to converge in the mean to a maximum of the importance weighted objective function (thus, broadly speaking, to a best fit of the demixing to the observations).

The main computational burden is steps 2b and 2c which are each $O(S^2 L_k)$.

The efficiency comes because
- On each iteration $L_k$ can be much less than T (although more iterations may be required)
- There are no multiplications by $\lambda_t$ in calculating G'
- The cost of choosing from R can be amortised across all frequencies (assuming that the weights are invariant across frequency)—that is, the same random choice of frames may be used for each of the frequencies.

For uniform weights, R can be replaced with a process of choosing $L_k$ frames from T, to avoid unnecessarily computing the update for duplicate chosen frames. In practice this also works with non-uniform weights, but it introduces a bias towards the uniform weighted solution as $L_k$ approaches T.

Tuning $L_k$

One can use a training data set, optionally from a variety of environments, to tune $L_k$. The objective is to achieve good performance in as computationally efficient manner as possible.

To achieve this one way is to start by looking at the first iteration and choosing a value $L_1$ which gives the best aggregate increase in performance per computation. Having fixed $L_1$ one goes on to choose $L_2$ and so forth. To speed up the tuning process, one can increment the number of iterations in steps of 5 rather than one at a time. The exact values for $L_k$ will depend upon the microphone array and the desired performance.

As an example, using an 8 channel microphone array, an experiment found that weighted ML-ICA needed 30 iterations of 120 frames to achieve a target performance. After tuning, the stochastic gradient version only needed 15 iterations at $L_k=20$ followed by 25 iterations at $L_k=28$ to give equivalent performance. This result is a factor of 3 reduction in computational load compared with weighted ML-ICA.

Scaling for Stability

One can exploit the scaling and permutation ambiguity of the procedure to improve the stability of the algorithm, and to facilitate the use of a fixed step size parameter $\mu$. Pre-scaling $W_f$ to maximise the likelihood can be performed efficiently in a way that can be rolled into the ICA update equations. However, we propose pre-scaling to minimise the substitute cost function $\|I-G\|_F^2$. We define a substitute cost function as one whose minimisers correspond to the stationary points of the original equation.

Note that in our case $\mu^2\|I-G\|_F^2$ corresponds to the norm of the ICA step in the associated Riemannian manifold. It is generally a better indicator of how close we are to the optimum than the likelihood. It is not always possible to directly minimise $\|I-G\|_F^2$, however in the case of pre-scaling it can also be done efficiently in a way that can be rolled into the ICA update equations. Consequently pre-scaling to minimise $\|I-G\|_F^2$ can give us better convergence characteristics and stability than pre-scaling to maximise the likelihood.

There are two versions of pre-scaling; diagonal and scalar rescaling. Both can use a fixed step size, for example $\mu \approx 0.5$, and give good convergence stability. Both versions have an additional cost of $O(S^2)$ which is small compared to the rest of the algorithm.

We will demonstrate the scaling algorithm using ISSG-ICA, but pre-scaling can also be applied in a similar manner to ML-ICA, weighted ML-ICA, and in other approaches.

Diagonal Rescaling

If we analyse the effect of pre-scaling $W_f$ by a non-negative real diagonal matrix C, we have $W_f \leftarrow CW_f$ $y_{fl} \leftarrow Cy_{fl}$ $G' \leftarrow G'C$ One can therefore calculate G' without pre-scaling and then minimise $\|I-G'C\|_F^2$ with respect to the diagonal elements of C. Noting that the diagonal elements of G' are non-negative real, and we obtain $$C_{ii} = \frac{G'_{ii}}{(G'^H G')_{ii}}$$

The update algorithm for each frequency becomes:

1. Initialise $W_f$
2. For each $k \in 1: K$
   a. Use $R$ to choose a subset of $L_k$ frames
   b. For each chosen frame $y_{fl} = W_f x_{fR_f(l)}$
   c. $G' = \frac{1}{2L} \sum_l \text{sign}(y_{fl}) y_{fl}^H$
   d. For each $i$: $C_{ii} = \frac{G'_{ii}}{(G'^H G')_{ii}}$
   d. $W_f \leftarrow ((1-\mu_k)I - \mu G'C)CW_f$ Scalar Rescaling Minimising $\|I-G'C\|_F^2$ with respect to a scalar C gives $$C = \frac{tr(G')}{tr(G'^H G')}$$

Other than the calculation of C the algorithm is the same as the diagonal version.

The diagonal version is most useful when there is a significant volume imbalance between the input channels. It can therefore be useful to use diagonal rescaling for the first few iterations then switch to scalar rescaling, which is slightly more computationally efficient.

If the input data has already been normalised in some fashion, for example as part of a dimension reduction step, the diagonal rescaling may be redundant.

Dimension Reduction

It will be noted that in the case that there are fewer sources than microphones, the ML-ICA algorithm is constrained to the subspace defined by the initial estimate of $W_f$.

As an optional alternative, the technique of dimension reduction can be used. In dimension reduction, the input data is projected onto a sub space, for example using principal component analysis (PCA), and ICA is applied to the projected data. The simplest form of dimension reduction is to discard microphones but PCA is better (reduced distortion) and may be employed by setting the M×S projection matrix $D_f$ to the set of eigenvectors corresponding to the largest eigenvalues of $X_f X_f^H$.

Thus where the number of sources is less than the number of microphones the microphone observations $x_f$ may be pre-processed by a multichannel linear filter $D_f$ which has fewer rows than columns:

$x_f' = D_f^H x_f$

A square S×S ICA matrix $W_f'$ can then be calculated from $X_f'$ using any of the ML-ICA algorithms described earlier and applied to this projected data $Y_f = W_f' X_f'$ Thus the original demixing matrix is found by $W_f = W_f' D_f^H$ The two methods are mathematically equivalent, but in general dimension reduction is more computationally efficient. Non-square ICA can be advantageous if:

1. The total frame set is very large, and the stochastic subsampled ICA is unlikely to access a given frame more than once over all iterations or 2. The compute architecture is vectorised so that the non-square matrix multiplications come for free. (e.g. a 5×5 matrix/vector product is no more efficient than a 5×8 matrix/vector product).

Frame Selection/Weighting

A separate process to the blind source separation process can be used to obtain metadata about the sources present, for example in captured frames stored in a frame buffer as described later. Such metadata may include information such as the source activity envelopes and location information: it is generally an easier problem to obtain this data than to perform the blind source separation (BSS).

In preferred embodiments the basic principle is to use this metadata to calculate an 'importance' value for each frame. We describe below some examples of heuristics which may employ frame metadata to determine an importance metric for a frame; one or more of these approaches may be used separately or in combination. Where a relative importance is defined ('lower' or 'higher'), this may be relative to an average value of an importance metric for the frames.

a) Frames that contain loud impulsive events like door slams may be assigned a relatively lower importance metric.
b) Frames that are very quiet may be assigned a relatively lower importance metric as they are unlikely to contain useful information for BSS.
c) Older frames may be assigned a relatively lower importance metric.
d) In a case where there are more sources present than the BSS procedure can separate (i.e. more sources than sensors), one or more of the following techniques may be used:

The sources may be classified into "required" and "extraneous" sources. Here "required" refers to a source being required for the purposes of separating a target source from other sources which may either be other potential target sources or one or more sources of interference. Thus a source of interference may be required in the blind source separation procedure so that it can be "tuned out", that is separated from one or more other sources present. By contrast an extraneous source is one which is not required either as a target source or as a source of interference to remove: It is often better to concentrate on separating the relevant sources and ignore the extraneous ones. Including the extraneous sources in the BSS problem can damage how well the relevant sources are separated, whereas excluding them simply means that a filtered version of the extraneous sources will be present on each output.

Excluding the extraneous sources is generally the more palatable option, although clearly perfect exclusion is not always possible. A source may be classified into "required" and "extraneous" based on, for example, one or more of the following.

i. Prior information such as a user selected/specific location
ii. Identification of a source as a commonly occurring loud source (e.g. a steady fan noise) may be used to define a source as "required"
iii. Identification of a source as a recently occurring source may be used to define a source as "required" (the most recently occurring sources are most likely to be active again in future)

Once a classification has been made frames that contain one or more required sources may be given a higher important metric than frames that contain one or more extraneous sources.

e) The contribution of (required) sources may be equalised: without equalisation a commonly occurring source will have more influence in the BSS algorithm than an infrequent one.

Once importance metric values or weights have been allocated to the frames the procedure can then use the importance values in updating a frame buffer storing past frames (see below). In particular, rather than overwriting the oldest frames, the procedure can instead choose to overwrite the unimportant frames (that is, a frame with less than a threshold value of importance metric and/or a stored frame with a lower importance metric than the new, incoming frame). This allows embodiments of the system to make maximum use of the frame buffer to record history relevant to the source separation problem. Preferably, once the frame buffer has been updated, the importance values are recalculated.

Scaling Ambiguity

Embodiments of the above described procedure extract the source estimates up to an arbitrary diagonal scaling matrix $B_f$. This is an arbitrary filter, since there is a value of $B_f$ at each frequency (this can be appreciated from the consideration that changing the bass or treble would not affect the independence of the sources). The arbitrary filter can be removed by considering what a source would have sounded like at a particular microphone.

In one approach, conceptually the scaling ambiguity can be resolved by taking one source, undoing the effect of the demixing to see what it would have sounded like at one or more of the microphones, and then using the result to adjust the scaling of the demixing matrix to match what was actually received (heard)—that is, applying a minimum distortion principle. However although this is what is taking place conceptually we only require knowledge of the demixing matrix and it is not necessary to actually undo the effect of the demixing.

The procedure can estimate the sources as received at the microphones using a minimum distortion principle as follows:

Let $\hat{W}_f$ be a combined demixing filter including any dimension reduction or other pre processing.
Let $\hat{W}_f^\dagger$ be the pseudo inverse of $\hat{W}_f$. This is a minimum distortion projection from the source estimates back to the microphones.
Let S(s) be a selector matrix which is zero everywhere except for one element on the diagonal $S(s)_{ss}=1$.
To project source estimate s back to all the microphones we use $$W_f'(s) = \hat{W}_f^\dagger S(s) \hat{W}_f \quad (25)$$

$$\hat{Y}_f(s) = W_f'(s) X_f \quad (26)$$

Matrix S(s) selects one source s, and equations (25) and (26) define an estimate for the selected source on all the microphones. In equation (26) $\hat{Y}_f(s)$ is an estimate of how the selected source would have sounded at microphones, rather than an estimate of the source itself, because the (unknown) room transfer function is still present.

Frequency Permutation

In embodiments of the techniques we describe the input signals are split into frequency bands and each frequency band is treated independently, and the results at different frequencies are then aligned. Thus in a matrix $W_f$ each row corresponds to a source, and the rows of the matrices $W_f$ for the frequencies concerned are permuted with the aim that a particular row always corresponds to the same source (row 1=source 1 and so forth). The skilled person will be aware of many published techniques for resolving the permutation ambiguity. For example, in one approach this may be done by assuming that when a source is producing power at one frequency it is probably also active at other frequencies.

Source Selection

Oftentimes it is only a subset of the sources that is desired. Because there may be a global permutation, it can be useful to estimate which of the sources are the desired ones—that is, the sources have been separated into independent components but there is still ambiguity as to which source is which (e.g. in the case of a group of speakers around a microphone, which source s is which speaker). In addition embodiments of the procedure operate on time slices of the audio (successive groups of STFT frames) and it is not guaranteed that the "physical" source labelled as, say, s=1 in one group of frames will be the same "physical" source as the source labelled as s=1 in the next group of frames (this depends upon the initialisation of W, which may, for example, be random or based on a previous group of frames).

Source selection may be made in various ways, for example on the basis of voice (or other audio) identification, or matching a user selected direction. Other procedures for selecting a source include selecting the loudest source (which may comprise selecting a direction from which there is most power); and selecting based upon a fixed (predetermined) direction for the application. For example a wanted source may be a speaker with a known direction with respect to the microphones. A still further approach is to look for a filter selecting a particular acoustic source which is similar to a filter in an adjacent time-frequency block, assuming that similar filters correspond to the same source. Such approaches enable a consistent global permutation matrix (P) to be determined from one time-frequency block to another.

In embodiments, to match a user-selected direction knowledge of the expected microphone phase response $\theta_{jf}$ from the indicated direction may be employed. This can either be measured or derived from a simple anechoic model given the microphone geometry relative to an arbitrary origin. A simple model of the response of microphone j may be constructed as follows:

Given the known geometry for each microphone we can define
  c is the speed of sound.
  $\underline{x}_j$ is the position of microphone j relative to an arbitrary origin in real space
  $\underline{d}$ is a unit vector corresponding to a chosen direction towards the desired source in the same coordinate system as $\underline{x}_j$.
  $f_{Hz}$ is the frequency (in Hertz) associated with STFT bin f.

The far field microphone time delay, $\tau_j$, in seconds relative to the origin is then given by $$\tau_j = -\frac{x_j^T d}{c}$$

This leads to a phase shift for microphone j of $$\theta_{jf} = e^{2\pi \tau_j f_{Hz} i}$$

However the phase response $\theta_{jf}$ is determined, the chosen source s is the source whose corresponding row in $\hat{W}_f^\dagger$ maximises the phase correlation:

$$s = \underset{k}{\mathrm{argmax}} \sum_f \left| \sum_j \frac{\hat{W}_{jkf}^\dagger}{|\hat{W}_{jkf}^\dagger|} \theta_{jf}^* \right|^2$$

where the sum j runs over the microphones and $\theta_{jf}$ if is the (complex) frequency/phase response of microphone j in the selected direction. In principle this approach could be employed to select multiple source directions.

The skilled person will appreciate that a similar approach enables one or more source directions to be determined from $\hat{W}_f^\dagger$, for example for weighting a (required or extraneous) source based on source direction.

Low Latency Implementation

In embodiments of the above described procedure the output of the procedure may be $Y_f$ or $\hat{Y}_f(s)$; additionally or alternatively an output may be the demixing filter $W_f$ or $W_f'(s)$. Where the output comprises a demixing filter this may be provided in the time-frequency domain or converted back into the time domain (as used in eq (1) above) and applied to the time domain data $x_t$. Where filtering is performed in the time domain the time domain data may be delayed so that the filtering is applied to the time domain data from which it was derived, or (as the calculations can be relatively time-consuming), the filtering may be applied to the current time domain data (thus using coefficients which are slightly delayed relative to the data)

In some real-time applications, such as a listening aid, low latency is desirable. In this case, the filtering may be performed in the time domain using eq (1). The filter coefficients w are updated by using the equation for $W_f'(s)$ ("Scaling Ambiguity", above) to design the filter coefficients asynchronously in the STFT domain. For example, if calculation of the filter coefficients can be performed, say, every second then the coefficients are around 1 second out of date. This presents no problem if the acoustic scene is reasonably static (the speakers do not move around much), so that the filter coefficients are appropriate for later samples. If low latency is not needed, the procedure can use an inverse STFT on the equation for $\hat{Y}_f(s)$ ("Scaling Ambiguity", above).

Stereo Filtering

A stereo output signal can be created by selecting an appropriate pair of rows from $W_f'$ in the equation for $W_f'(s)$ ("Scaling Ambiguity", above). This leads to a more natural sounding output which still retains some of the spatial cues from the source.

Example Implementations

Figure 2:
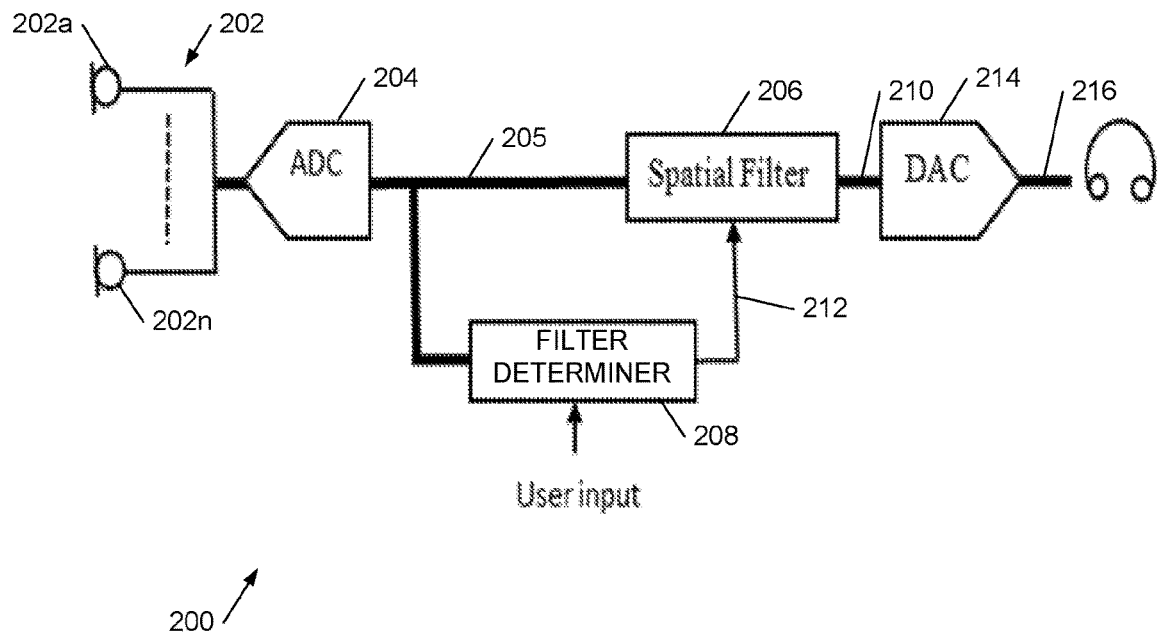
FIG. 2 shows an example architecture of apparatus for audio signal blind source separation.

Referring to FIG. 2, this shows the architecture of apparatus 200 to improve the audibility of an audio signal by blind source separation, employing time-domain filtering to provide low latency. The apparatus comprises a microphone array 202 with microphones 202a-n, coupled to a multi-channel analogue-to-digital converter 204. This provides a digitised multi-channel audio output 205 to a spatial filter 206 which may be implemented as a multi-channel linear convolutional filter, and to a filter coefficient determiner 208. The filter coefficient determiner 208 determines coefficients of a demixing filter which are applied by spatial filter 206 to extract audio from one (or more) selected sources for a demixed audio output 210. The filter determiner 208 accepts optional user input, for example to select a source, and has an output 212 comprising demixing filter coefficients for the selected source. The demixed audio 210 is provided to a digital-to-analogue converter 214 which provides a time domain audio output 216, for example to headphones or the like, or for storage/further processing (for example speech recognition), communication (for example over a wired or wireless network such as a mobile phone network and/or the Internet), or other uses. In FIG. 2 the audio signal path is shown in bold.

In embodiments it is assumed that the acoustic scene is quasi-static and thus the filter coefficient determiner 208 and spatial filter 206 can operate in parallel. The latency is then determined by the main acoustic path (shown in bold), and depends upon the group delay of the filter coefficients, the latency of the spatial filter implementation, and the input/output transmission delays. Many different types of spatial filter may be used—for example one low latency filter implementation is to use a direct convolution; a more computationally efficient alternative is described in Gardener, W G (1995), "Efficient Convolution without Input-output Delay", *Journal of the Audio Engineering Society'*, 43 (3), 127-136.

The skilled person will recognise that the signal processing illustrated in the architecture of FIG. 2 may be implemented in many different ways. For example the filter designer, in preferred embodiments with a user interface, and/or spatial filter and/or DAC 214 may be implemented on a general purpose computing device such as a mobile phone, tablet, laptop or personal computer. In embodiments the microphone array and ADC 204 may comprise part of such a general purpose computing device. Alternatively some or all of the architecture of FIG. 2 may be implemented on a dedicated device such as dedicated hardware (for example an ASIC), and/or using a digital signal processor (DSP). A dedicated approach may reduce the latency on the main acoustic path which is otherwise associated with input/output to/from a general purpose computing device, but this may be traded against the convenience of use of a general purpose device.

Figure 3A:
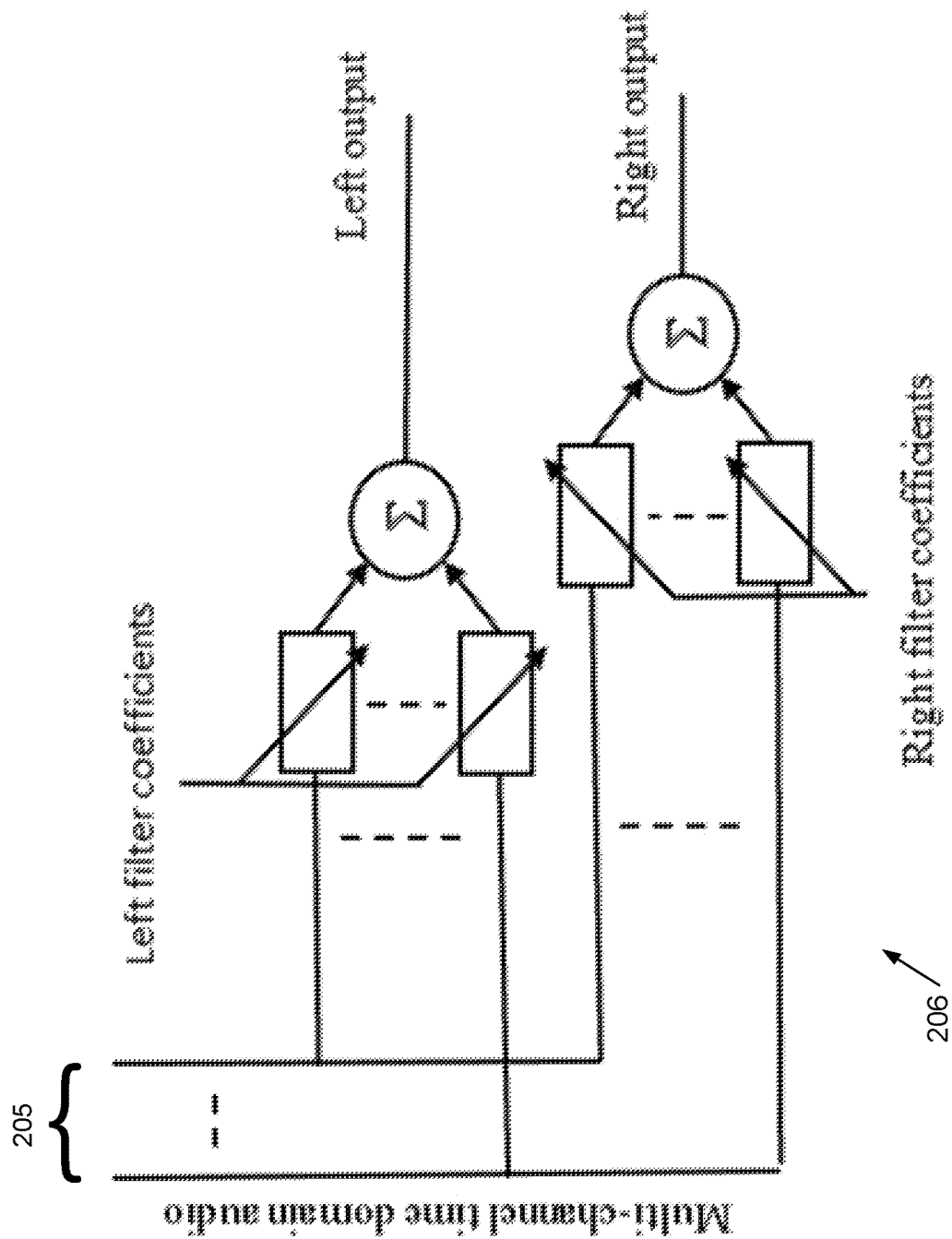
FIGS. 3a and 3b show, respectively, an example spatial filter for the apparatus of FIG. 2, and an example implementation of frame buffer management according to embodiments of the invention.
Figure 3B:
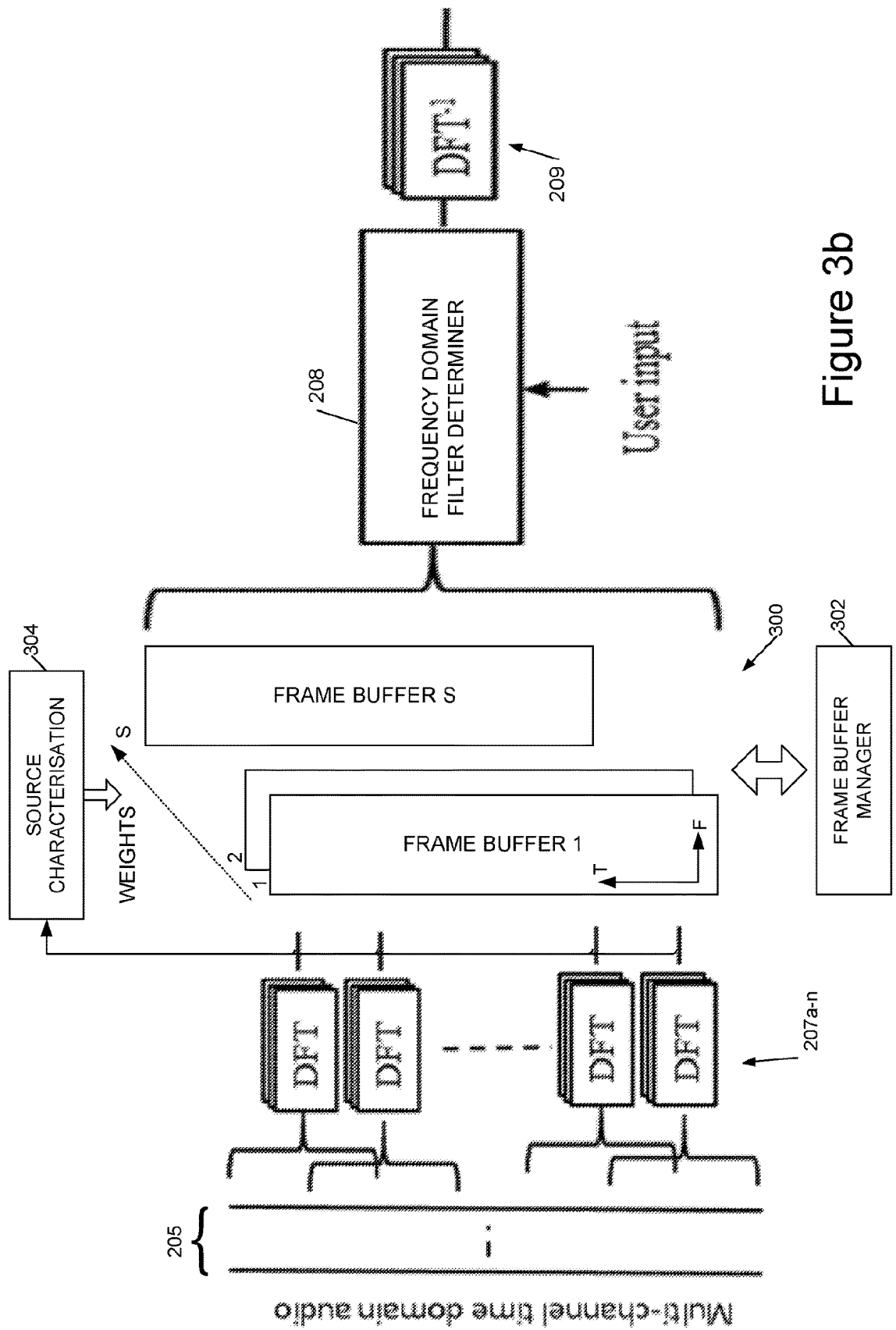

An example spatial filter 206 for the apparatus of FIG. 2 is shown in FIG. 3*a*. The illustrated example shows a multi-channel linear discrete convolution filter in which the output is the sum of the audio input channels convolved with their respective filter coefficients, as described in eq (1) above. In embodiments a multi-channel output such as a stereo output is provided. For a stereo output either the spatial filter output may be copied to all the output channels or more preferably, as shown in FIG. 3*a*, a separate spatial filter is provided for each output channel. This latter approach is advantageous as it can approximate the source as heard by each ear (since the microphones are spaced apart from one another). This can lead to a more natural sounding output which still retains some spatial cues from the source FIG. 3*b* shows an example implementation of frame buffer management according to embodiments of the invention. FIG. 3*b* also illustrates time-frequency and frequency-time domain conversions (not shown in FIG. 2) for the frequency domain filter coefficient determiner 208 of FIG. 2. In embodiments each audio channel may be provided with an STFT (Short Time Fourier Transform) module 207*a-n* each configured to perform a succession of overlapping discrete Fourier transforms on an audio channel to generate a time sequence of spectra. Transformation of filter coefficients back into the time domain may be performed by a set of inverse discrete Fourier transforms 209.

The Discrete Fourier Transform (DFT) is a method of transforming a block of data between a time domain representation and a frequency domain representation. The STFT is an invertible method where overlapping time domain frames are transformed using the DFT to a time-frequency domain. The STFT is used to apply the filtering in the time-frequency domain; in embodiments when processing each audio channel, each channel in a frame is transformed independently using a DFT. Optionally the spatial filtering could also be applied in the time-frequency domain, but this incurs a processing latency and thus more preferably the filter coefficients are determined in the time-frequency domain and then inverse transformed back into the time domain. The time domain convolution maps to frequency domain multiplication.

As shown in FIG. 3*b*, a frame buffer system is provided comprising a T×F frame buffer X for each microphone 1 . . . M. These store time-frequency data frames in association with frame weight/probability data as previously described. In embodiments the microphone STFT data are interleaved so that there is one frame buffer containing M×F×T STFT points. A frame buffer manager 302 operates under control of the procedure to read the stored weights for frame selection/weighting. In embodiments the frame buffer manager 302 also controls one or more pointers to identify one or more location(s) at which new (incoming) data is written into a buffer, for example to overwrite relatively less important frames with relatively more important frames. Optionally frame buffer system 300 may comprise two sets of frame buffers (for each microphone), one to accumulate new data whilst previously accumulated data from a second buffer is processed; then the second buffer can be updated. In embodiments a frame buffer may be relatively large—for example, single precision floating point STFT data at 16 kHz with 50% overlap between frames translates to 8 MB of data per microphone per minute of frame buffer. However the system may accumulate new frames in a temporary buffer while calculating the filter coefficients and at the beginning of the next update cycle update the frame buffer from this temporary buffer (so that a complete duplicate frame buffer is not required).

The frame weights are determined by a source characterisation module 304. In embodiments this determines frame weights according to one or more of the previously described heuristics. This may operate in the time domain or (more preferably) in the time-frequency domain as illustrated. More particularly, in embodiments this may implement a multiple-source direction of arrival (DOA) estimation procedure. The skilled person will be aware of many suitable procedures including, for example, an MVDR (Minimum Variance Distortionless Response) beamformer, the MUSIC (Multiple Signal Classification) procedure, or a Fourier method (finding the peaks in the angular Fourier spectrum of the acoustic signals, obtained from a combination of the sensor array response and observations X).

The output data from such a procedure may comprise time series data indicating source activity (amplitude) and source direction. The time or time-frequency domain data or output of such a procedure may also be used to identify: a frame containing an impulsive event; and/or frames with less than a threshold sound level; and/or to classify a sound, for example as air conditioning or the like.

Figure 4:
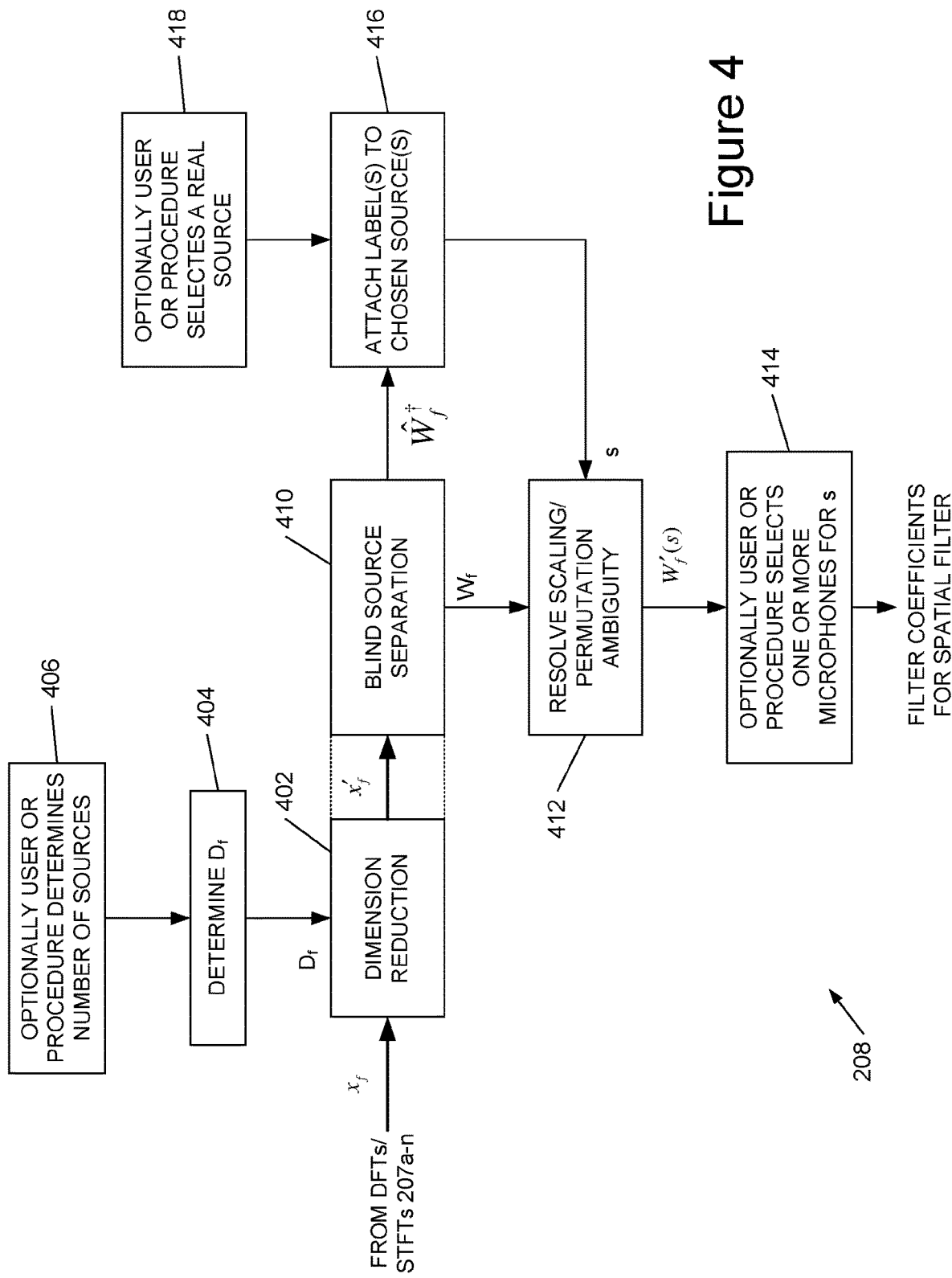
FIG. 4 shows modules of a time-frequency domain, filter-determining system for the apparatus of FIG. 2.

Referring now to FIG. 4, this shows modules of an example implementation of a frequency domain filter coefficient determiner 208 for use in embodiments of the invention. The modules of FIG. 4 operate according to the procedure as previously described. Thus the filter coefficient determination system receives digitised audio data from the multiple audio channels in a time-frequency representation, from the STFT modules 207*a-n* of FIG. 3*b*, defining the previously described observations $x_f$. This is provided to an optional dimension reduction module 402 which reduces the effective number of audio channels according to a dimension reduction matrix $D_f$. The dimension reduction matrix may be determined (module 404) either in response to user input defining the number of sources to demix or in response to a determination by the system of the number of sources to demix, step 406. The procedure may determine the number of sources based upon prior knowledge, or a DOA-type technique, or, for example, on some heuristic measure of the output or, say, based on user feedback on the quality of demixed output. In a simple implementation the dimension reduction matrix may simply discard some of the audio input channels but in other approaches the input channels can be mapped to a reduced number of channels, for example using PCA as previously outlined. The complete or reduced set of audio channels is provided to a blind source separation module 410 which implements a procedure as previously described to perform importance weighted/stochastic gradient-based blind source separation. As illustrated by the dashed lines, optionally dimension reduction may effectively be part of the blind source separation 410.

The blind source separation module 410 provides a set of demixing matrices as an output, defining frequency domain filter coefficients $W_f$. In embodiments these are provided to module 412 which removes the scaling ambiguity as previously described, providing filter coefficients for a source s at all the microphones (or reduced set of microphones). The user or the procedure then selects one or more of these microphones (by selecting data from one or more rows of $W_f(s)$), which are then output for use by the spatial filter after conversion back into the time domain.

In embodiments a source selection module 416 operates on a pseudo inverse of the demixing matrix, using the microphone phase responses to choose a source s. The source may be selected 418 either by the user, for example the user indicating a direction of the desired source, or by the procedure, for example based on a priori knowledge of the source direction.

Figure 5:
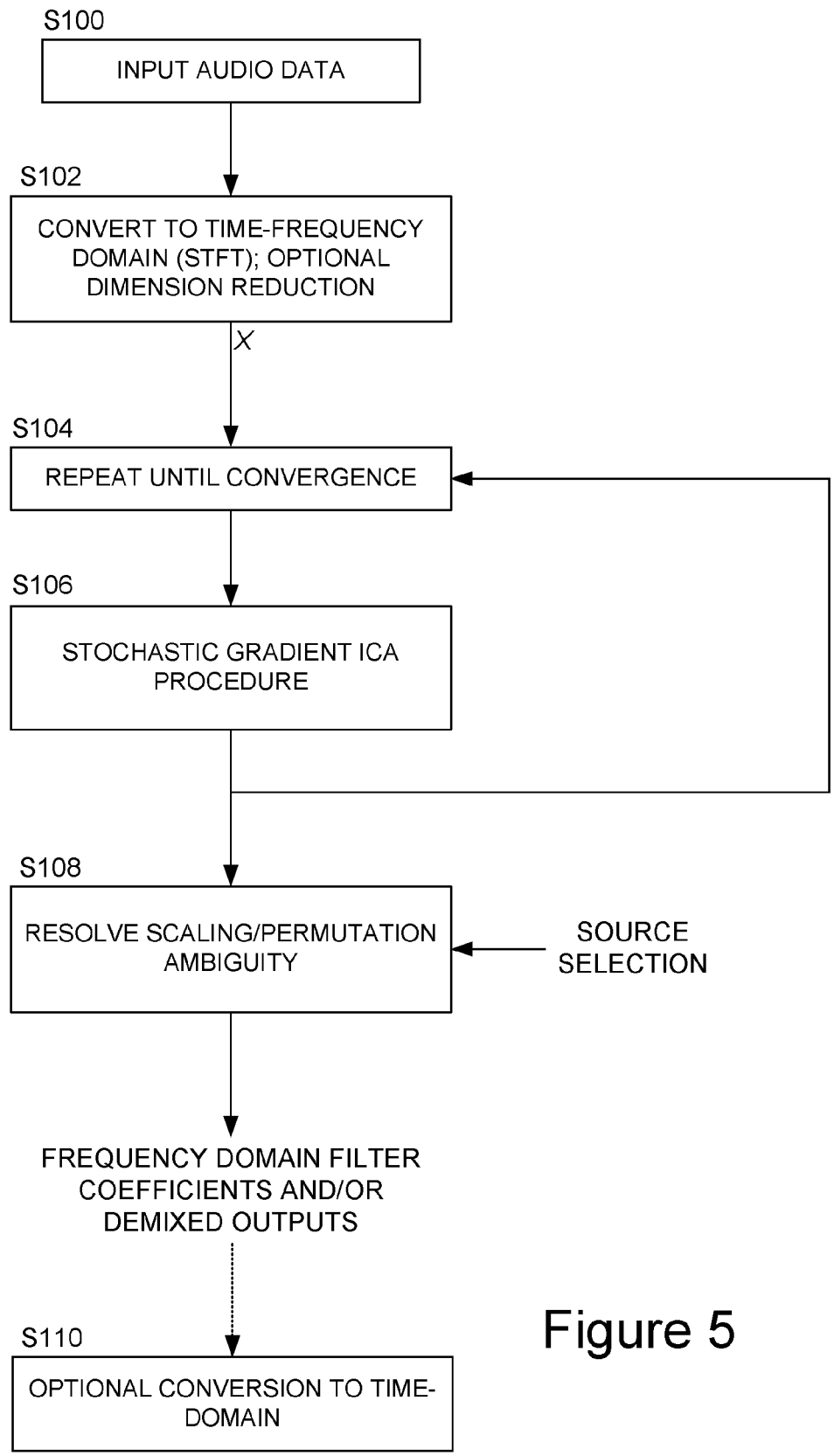
FIG. 5 shows a flow diagram of a procedure for blind source separation according to an embodiment of the invention.

FIG. 5 shows a flow diagram of a procedure for blind source separation according to an embodiment of the invention; this procedure may be used to implement the blind source separation module 410 and dimension reduction 402 of FIG. 4. Thus at step S100 the procedure inputs audio data and then converts this to the time-frequency domain, optionally reducing the number of audio channels (S102). The procedure then repeats a number of update steps of an importance weighting/stochastic gradient BSS procedure as previously described (S106) until convergence (S104); the convergence criterion may be a fixed number of iterations. Once convergence has been achieved preferably the procedure resolves scaling and permutation ambiguity, for example as previously described (S108; implemented in module 412 of FIG. 4), and optionally converts the filter coefficients back to the time domain (S110).

Figure 6:
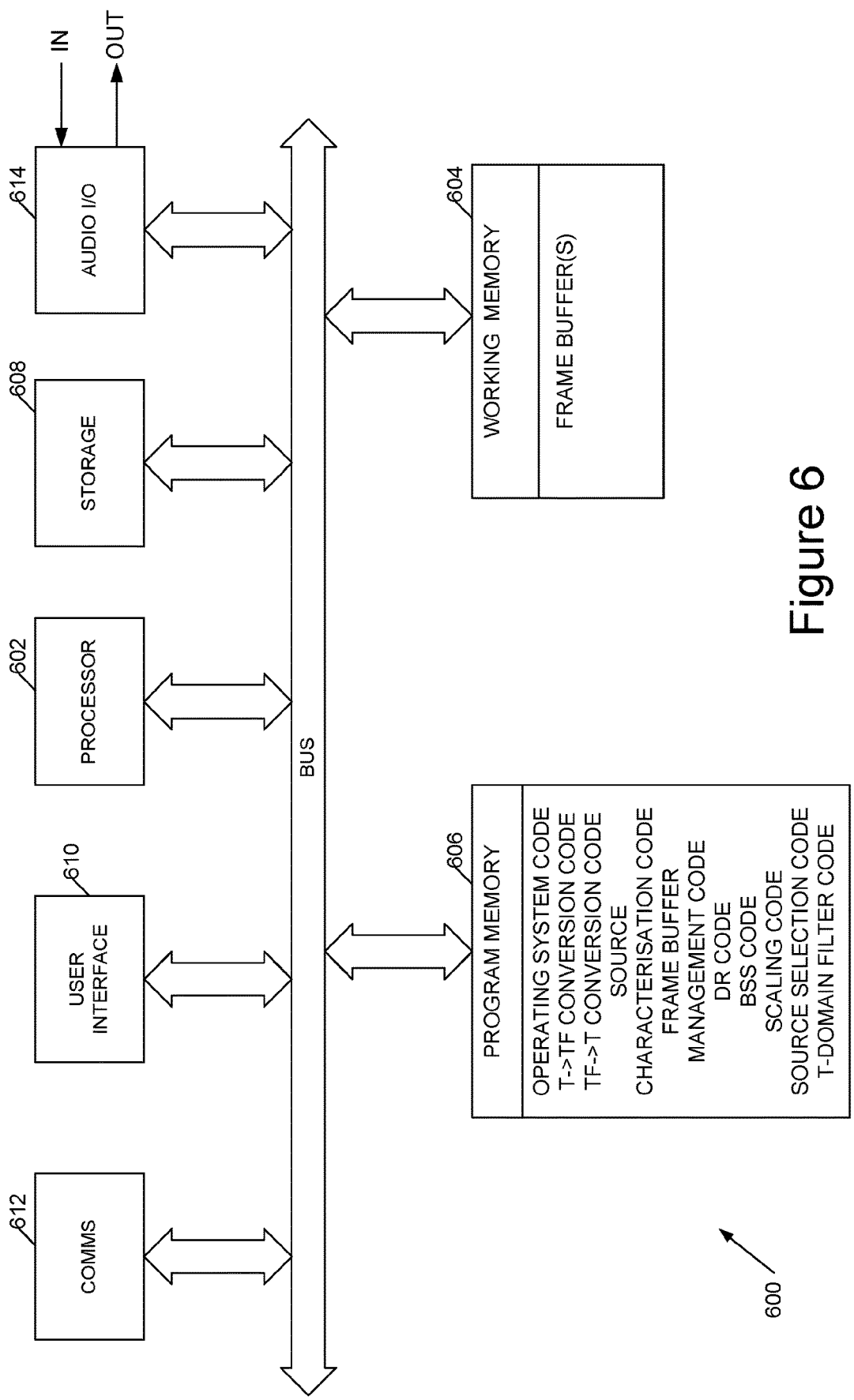
FIG. 6 shows a general purpose computing system programmed to implement blind source separation according to an embodiment of the invention.

FIG. 6 shows an example of a general purpose computing system 600 programmed to implement a system as described above to improve audibility of an audio signal by blind source separation according to an embodiment of the invention. Thus the computing system comprises a processor 602, coupled to working memory 604, program memory 606, and to storage 608, such as a hard disk. Program memory 606 comprises code to implement embodiments of the invention, for example operating system code, time to frequency domain conversion code, frequency to time domain conversion code, source characterisation code, frame buffer management code, (optional) dimension reduction code, blind source separation code, scaling/permutation code, source selection code, and spatial (time domain) filter code. Working memory 604/storage 608 stores data for the above-described procedure, and also implements the frame buffer(s). Processor 602 is also coupled to a user interface 612, to a network/communications interface 612, and to an (analogue or digital) audio data input/output module 614. The skilled person will recognise that audio module 614 is optional since the audio data may alternatively be obtained, for example, via network/communications interface 612 or from storage 608.

Although in some preferred implementations the above described techniques are applied to audio comprising speech, the techniques are not limited to such applications and can be applied to other acoustic source separation problems, for example processing seismic data. Often a selected source comprises a human speaker to provide a listening aid or to assist teleconferencing, machine hearing or speech recognition, or other in applications such as selectively capturing speech from a driver or passenger in a vehicle for a vehicle phone. In some applications, however, embodiments of the techniques may be employed to identify a noise-like source (for example a source with the most noise-like characteristics may be selected), and this selected source may then be employed for active noise cancellation.

In principle the techniques we describe may be employed outside the audio/acoustic domain, for example to mixed-source electrical signal data such as data from sensing apparatus or instrumentation such as laboratory or medical apparatus. Examples include EEG (electroencephalography) data, and mixed source spectral data from a spectrum analyser such as an optical spectrum analyser, mass spectrum analyser or the like.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method for acoustic source separation, the method comprising:
inputting acoustic data from a plurality of acoustic sensors, said acoustic data comprising acoustic signals combined from a plurality of acoustic sources;
converting said acoustic data to time-frequency domain data comprising a plurality of time-frequency data frames for a plurality of times and frequencies; and
constructing a multichannel filter to operate on said time-frequency data frames to separate signals from said acoustic sources;
wherein said constructing comprises:
determining a set of de-mixing matrices ($W_f$), one for each of said plurality of frequencies, to apply to each said time-frequency data frame to determine a vector of separated outputs ($\underline{y}_{ft}$), wherein said determining comprises modifying each of said de-mixing matrices by a respective gradient value (G;G') for a said frequency dependent upon a gradient of a cost function measuring a separation of said sources by the respective said de-mixing matrix; and
wherein said respective gradient values for each frequency are each calculated from a stochastic selection of said time-frequency data frames,
wherein said stochastic selection of said time-frequency data frames comprises randomly selecting a plurality, L, of said time-frequency data frames for determining each of said de-mixing matrices ($W_f$).

2. A method as claimed in claim 1 wherein the same value L is used for determining a plurality or all of said de-mixing matrices ($W_f$) for said plurality of frequencies.

3. A method as claimed in claim 1 further comprising selecting said time-frequency data frames according to a selection probability $\lambda_t$ associated with each frame, where $\lambda_t$ represents the probability of selecting a time-frequency data frame for time t.

4. A method as claimed in claim 3 further comprising determining a value for $\lambda_t$ dependent upon an importance metric for the time-frequency data frame for time t.

5. A method as claimed in claim 4 further comprising determining source activity data from said acoustic data, and determining said importance metric $\lambda_t$ for a time-frequency data frame from said source activity data.

6. A method as claimed in claim 5 wherein said importance metric is defined to equalise contributions from sources with different numbers of frames in which the sources are active.

7. A method as claimed in claim 1 comprising iteratively modifying each of said de-mixing matrices by said respective gradient value, and varying the number L of stochastically selected time-frequency data frames from one iteration to another.

8. A method as claimed in claim 1 further comprising prescaling said set of de-mixing matrices ($W_f$) to minimise a substitute cost function prior to constructing said multichannel filter.

9. A method of blind source separation using the method of claim 1 to construct said multichannel filter;
applying said multichannel filter to said time-frequency domain data to determine de-mixed time-frequency data representing said acoustic sources; and
converting said de-mixed time-frequency data to the time domain to recover de-mixed time domain data for at least one of said acoustic sources.

10. A non-transitory storage medium storing processor control code to implement the method of claim 1.

11. A system for acoustic source separation, the system comprising:
one or more inputs to receive acoustic data from a plurality of acoustic sensors, said acoustic data comprising acoustic signals combined from a plurality of acoustic sources; and
an audio signal processor coupled to said one or more inputs, the audio signal processor comprising:
a time-to-frequency domain converter to convert said acoustic data to time-frequency domain data comprising a plurality of time-frequency data frames for a plurality of times and frequencies; and
a multichannel filter module to operate on said time-frequency data frames to separate signals from said acoustic sources; and
wherein said audio signal processor is further configured to:
determine a set of de-mixing matrices ($W_f$), one for each of said plurality of frequencies, to apply to each said time-frequency data frame to determine a vector of separated outputs ($\underline{y}_{ft}$), by modifying each of said de-mixing matrices by a respective gradient value (G;G') for a said frequency dependent upon a gradient of a cost function measuring a separation of said sources by the respective said de-mixing matrix; and to
calculate said respective gradient values for each frequency from a stochastic selection of said time-frequency data frames,
wherein said stochastic selection of said time-frequency data frames comprises randomly selecting a plurality, L, of said time-frequency data frames for determining each of said de-mixing matrices ($W_f$).

* * * * *